(12) United States Patent
Jin et al.

(10) Patent No.: US 9,570,652 B2
(45) Date of Patent: Feb. 14, 2017

(54) LIGHT EMITTING DIODES

(71) Applicants: Tsinghua University, Beijing (CN);
HON HAI PRECISION INDUSTRY CO., LTD., New Taipei (TW)

(72) Inventors: Yuan-Hao Jin, Beijing (CN);
Qun-Qing Li, Beijing (CN);
Shou-Shan Fan, Beijing (CN)

(73) Assignees: Tsinghua University, Beijing (CN);
HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 13/728,031

(22) Filed: Dec. 27, 2012

(65) Prior Publication Data

US 2013/0256708 A1 Oct. 3, 2013

(30) Foreign Application Priority Data

Mar. 30, 2012 (CN) .......................... 2012 1 0089076

(51) Int. Cl.
*H01L 27/15* (2006.01)
*H01L 33/08* (2010.01)
(Continued)

(52) U.S. Cl.
CPC ............... *H01L 33/08* (2013.01); *H01L 27/15* (2013.01); *H01L 27/153* (2013.01);
(Continued)

(58) Field of Classification Search
CPC ........ H01L 27/156; H01L 33/10; H01L 33/22;
H01L 33/32; H01L 33/38; H01L 33/387;
H01L 27/15; H01L 27/153; H01L 33/007;
H01L 33/08; H01L 33/24; H01L 33/30;
H01L 33/46; H01L 33/20; H01L 33/40;
H01L 33/405; H01L 33/60; A61B 1/0684
(Continued)

(56) References Cited

U.S. PATENT DOCUMENTS 5,055,893 A * 10/1991 Sasagawa ........................ 257/88
5,526,190 A * 6/1996 Hubble et al. ................ 359/719
(Continued)

FOREIGN PATENT DOCUMENTS

CN 101999178 3/2011
CN 102097518 6/2011
(Continued)

OTHER PUBLICATIONS

Nelson et al., "Electric-Field-Induced Impact Ionization of Excitons in GaN and GaN/AlGaN Quantum Wells", in the section entitled "Low-Dimensional Systems and Surface Physics" of the journal "Physics of the Solid State", vol. 43, No. 12, 2001 (pp. 2321-2327).*
(Continued)

*Primary Examiner* — Johannes P Mondt
(74) *Attorney, Agent, or Firm* — Zhigang Ma

(57) ABSTRACT

An LED is provided. The LED includes at least two light emitting units located on a same plane. Each light emitting unit includes a first semiconductor layer, an active layer and a second semiconductor layer stacked in that order. Each light emitting unit further includes a first electrode and a second electrode electrically connected with the first semiconductor layer and the second semiconductor layer respectively. The active layer of each light emitting unit is spaced from the active layers of other light emitting units. A distance between adjacent active layer ranges from 1 micron to 1 millimeter.

12 Claims, 8 Drawing Sheets

(51) Int. Cl.
*H01L 33/46* (2010.01)
*H01L 33/60* (2010.01)
*H01L 33/00* (2010.01)
*H01L 33/20* (2010.01)

(52) U.S. Cl.
CPC ............ *H01L 33/007* (2013.01); *H01L 33/46* (2013.01); *H01L 33/60* (2013.01); *H01L 33/20* (2013.01)

(58) Field of Classification Search
USPC ............................................... 257/88–93, 98
See application file for complete search history.

(56) References Cited

U.S. PATENT DOCUMENTS

| | | | |
|---|---|---|---|
| 5,696,389 | A | 12/1997 | Ishikawa et al. |
| 5,853,960 | A | 12/1998 | Tran et al. |
| 6,258,618 | B1 * | 7/2001 | Lester ............... 438/46 |
| 6,495,862 | B1 | 12/2002 | Okazaki et al. |
| 6,504,180 | B1 * | 1/2003 | Heremans et al. ........ 257/98 |
| 6,781,160 | B1 | 8/2004 | Tsai et al. |
| 7,932,534 | B2 * | 4/2011 | Singh et al. ............ 257/98 |
| 2002/0139987 | A1 * | 10/2002 | Collins et al. ............ 257/88 |
| 2003/0062530 | A1 | 4/2003 | Okazaki et al. |
| 2003/0178626 | A1 | 9/2003 | Sugiyama et al. |
| 2006/0048811 | A1 * | 3/2006 | Krut et al. ............ 136/249 |
| 2007/0018182 | A1 | 1/2007 | Beeson et al. |
| 2007/0205382 | A1 * | 9/2007 | Gaska et al. ............ 250/504 R |
| 2007/0252164 | A1 | 11/2007 | Zhong et al. |
| 2008/0303047 | A1 | 12/2008 | Shen et al. |
| 2010/0059789 | A1 | 3/2010 | Choi |
| 2010/0264401 | A1 * | 10/2010 | Adivarahan et al. .......... 257/13 |
| 2010/0264454 | A1 | 10/2010 | Yi et al. |
| 2010/0308359 | A1 | 12/2010 | Singh et al. |
| 2011/0044362 | A1 * | 2/2011 | Wada et al. ............... 372/45.01 |
| 2011/0088778 | A1 | 4/2011 | Lin et al. |
| 2011/0193119 | A1 | 8/2011 | Chen et al. |
| 2011/0204324 | A1 * | 8/2011 | Kim ............................... 257/13 |
| 2011/0303893 | A1 | 12/2011 | Wagner et al. |
| 2012/0051079 | A1 * | 3/2012 | Saito et al. .................. 362/538 |
| 2012/0152353 | A1 | 6/2012 | Zhu et al. |

FOREIGN PATENT DOCUMENTS

| | | | |
|---|---|---|---|
| CN | 102117889 | 7/2011 | |
| DE | 19630751 A1 * | 2/1997 | ............ H01L 33/00 |
| TW | 575984 | 2/2004 | |
| TW | 200501449 | 1/2005 | |
| TW | 200845420 | 11/2008 | |
| TW | 200945609 | 11/2009 | |
| TW | 201006002 | 2/2010 | |
| TW | 201027808 | 7/2010 | |
| TW | 201031032 | 8/2010 | |
| TW | 201119063 | 6/2011 | |
| TW | 201121100 | 6/2011 | |
| TW | 201143135 | 12/2011 | |
| WO | 2012018163 | 2/2012 | |

OTHER PUBLICATIONS

Nakamura et al., "Superbright Gree InGaN Single-Quantum-Well-Staructure Light-Emitting Diode", Japanese Journal cof Applied Physics, vol. 34 (1995), pp. L1332-L1335.*

* cited by examiner

LIGHT EMITTING DIODES

CROSS-REFERENCE TO RELATED APPLICATIONS

This application claims all benefits accruing under 35 U.S.C. §119 from China Patent Application No. 201210089076.7, filed on Mar. 30, 2012 in the China Intellectual Property Office, the disclosure of which is incorporated herein by reference. This application is related to applications entitled, "METHOD FOR MAKING SOLAR CELLS", U.S. application Ser. No. 13/727,988, filed Dec. 27, 2012; "SOLAR CELLS", Ser. No. 13/727,999, filed Dec. 27, 2012; "WHITE LIGHT EMITTING DIODES", Ser. No. 13/728,006, filed Dec. 27, 2012; "METHOD FOR MAKING LIGHT EMITTING DIODES", Ser. No. 13/728,018, filed Dec. 27, 2012; "LIGHT EMITTING DIODES", Ser. No. 13/728,035, filed Dec. 12, 2012; "METHOD FOR MAKING LIGHT EMITTING DIODES", Ser. No. 13/728,043, filed Dec. 27, 2012; "LIGHT EMITTING DIODES", Ser. No. 13/728,054, filed Dec. 27, 2012; "LIGHT EMITTING DIODES AND OPTICAL ELEMENTS", Ser. No. 13/728,063, filed Dec. 27, 2012; and "METHOD FOR MAKING LIGHT EMITTING DIODES AND OPTICAL ELEMENTS", Ser. No. 13/728,076, filed Dec. 27, 2012.

BACKGROUND

1. Technical Field

The present disclosure relates to a light emitting diode (LED).

2. Discussion of Related Art

LED modules are widely used as light sources in optical imaging systems, such as displays, projectors, and so on.

A conventional LED commonly includes an N-type semiconductor layer, a P-type semiconductor layer, an active layer, a first electrode, and a second electrode. The active layer is located between the N-type semiconductor layer and the P-type semiconductor layer. The second electrode is located on the P-type semiconductor layer. The first electrode is located on the N-type semiconductor layer. Typically, the second electrode is transparent. In operation, a positive voltage and a negative voltage are applied respectively to the P-type semiconductor layer and the N-type semiconductor layer. Thus, the holes in the P-type semiconductor layer and the electrons in the N-type semiconductor layer can enter the active layer and combine with each other to emit visible light.

However, the efficiency of LEDs is limited by several factors including the visible light emitted from sidewalls of the LEDs cannot be used. Therefore, an external quantum efficiency of LEDs is low.

What is needed, therefore, is to provide a light emitting diode, which can overcome the above-described shortcomings.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
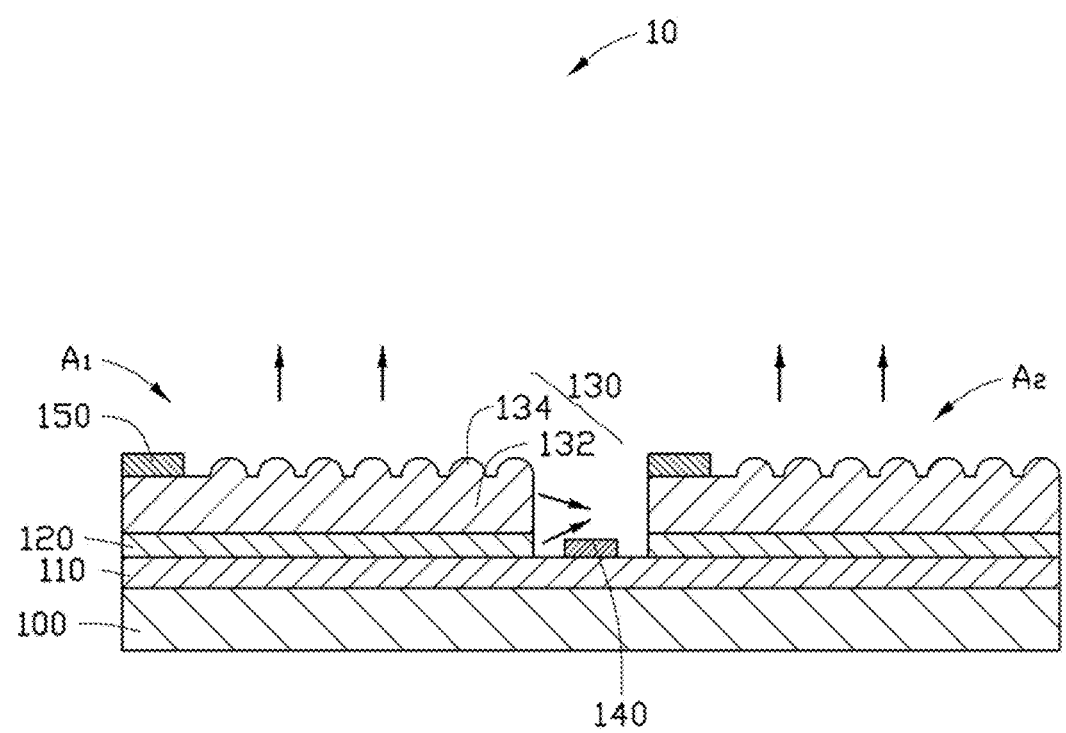
FIG. 1 is a profile view of one embodiment of a light emitting diode.

Referring to FIG. 1, one embodiment of an LED 10 is provided. The LED 10 includes a light emitting unit $A_1$ and a light emitting unit $A_2$. The light emitting unit $A_1$ and the light emitting unit $A_2$ are located on a same plane. The light emitting unit $A_1$ and the light emitting unit $A_2$ have a same first LED structure. The first LED structure includes a substrate 100, a first semiconductor layer 110, an active layer 120, a second semiconductor layer 130, a first electrode 140, and a second electrode 150.

The light emitting unit $A_1$ and the light emitting unit $A_2$ can be an integrated structure, that is, the light emitting unit $A_1$ and light emitting unit $A_2$ can share a same substrate 100, a same first semiconductor layer 110 and a same first electrode 140. The substrate 100 can include an epitaxial growth surface. The first semiconductor layer 110 can be located on the epitaxial growth surface of the substrate 100. The first electrode 140 can be electrically connected to the first semiconductor layer 110. Each active layer 120 can be located on different regions of a surface of the first semiconductor layer 110 away from the substrate 100. A distance between the active layer 120 of the light emitting unit $A_1$ and the active layer 120 of the light emitting unit $A_2$ can range from about 1 micron to about 1 millimeter. Each second semiconductor layer 130 can be located on a surface of each active layer 120 away from the first semiconductor layer 110. Each second electrode 150 can be electrically connected to each second semiconductor layer 130. A surface of each second semiconductor layer 130 away from the active layer 120 can be a light emitting surface of the LED 10.

The substrate 100 is adapted to support the first semiconductor layer 110. A size, thickness, and shape of the substrate 100 can be selected according to need. The epitaxial growth surface of the substrate 100 can be a clean and smooth surface. A material of the substrate 100 can be $LiGaO_2$, $LiAlO_2$, $Al_2O_3$, Si, GaAs, GaN, GaSb, InN, InP, InAs, InSb, AlP, AlAs, AlSb, AN, GaP, SiC, SiGe, GaMnAs, GaAlAs, GaInAs, GaAlN, GaInN, AlInN, GaAsP, InGaN, AlGaInN, AlGaInP, GaP:Zn or GaP:N. The first semiconductor layer 110 and the substrate 100 should have a small crystal lattice mismatch and a thermal expansion mismatch. In one embodiment, the substrate 100 is a sapphire substrate having a thickness of about 400 micron.

The first semiconductor layer 110 can be located on the epitaxial growth surface. In one embodiment, the first semiconductor layer 110 covers the entire epitaxial growth surface of the substrate 100. The first semiconductor layer 110 can be an N-type semiconductor or a P-type semiconductor. A material of the N-type semiconductor can include N-type gallium nitride, N-type gallium arsenide, or N-type copper phosphate. A material of the P-type semiconductor can include P-type gallium nitride, P-type gallium arsenide, or P-type copper phosphate. The N-type semiconductor can be used to provide electrons, and the P-type semiconductor can be configured to provide holes. A thickness of the first semiconductor layer 110 can range from about 1 micron to about 5 micron. In one embodiment, the first semiconductor layer 110 is an N-type gallium nitride semiconductor layer.

The surface of the first semiconductor layer 110, away from the substrate 100, can include a number of first regions and a second region based on their function. The first regions can be used to locate the active layers 120. The second region can be used to locate the first electrode 140. The number of the first regions can be equal to the number of the light emitting units. A distance between adjacent first regions can range from about 1 micron to about 1 millimeter. In one embodiment, the surface of the first semiconductor layer 110 away from the substrate 100 includes two first regions and one second region.

In some embodiments, the LED 10 further includes a buffer layer (not shown) located on the epitaxial growth surface of substrate 100. Because the first semiconductor layer 110 and the substrate 100 have different lattice constants, the buffer layer can be used to reduce the lattice mismatch. As such, a dislocation density of the first semiconductor layer 110 will decrease. A thickness of the buffer layer can range from about 10 nanometers to about 300 nanometers. A material of the buffer layer can be GaN or AlN.

Each active layer 120 can be located on each first region. In one embodiment, each the active layer 120 covers the entire surface of each first region. Each active layer 120 can be a photon excitation layer. The photon excitation layer can be a single layer quantum well film or multilayer quantum well films. A material of each active layer 120 can be GaN, GaInN, AlGaInN, GaSn, AlGaSn, GaInP, or GaInSn. A thickness of each active layer 120 can range from about 0.01 μm to about 0.6 μm. In one embodiment, each active layer 120 has a thickness of about 0.3 μm and includes a layer of GaInN and a layer of GaN stacked with the GaInN layer.

Each second semiconductor layer 130 can be located on a surface of each active layer 120 away from the first semiconductor layer 110. In one embodiment, each second semiconductor layer 130 covers the entire surface of each active layer 120. A thickness of the second semiconductor layer 130 can range from about 0.1 micron to about 3 micron. The second semiconductor layer 130 can be an N-type semiconductor layer or a P-type semiconductor layer. Furthermore, the type of the second semiconductor layer 130 is different from the type of the first semiconductor layer 110. In one embodiment, each second semiconductor layer 130 is a P-type gallium nitride doped with Mg and the thickness of the second semiconductor layer 130 is about 0.3 μm.

Each second semiconductor layer 130 can include a body 132 and a number of first three-dimensional nano-structures 134 protruding out of a surface of the body 132. The first three-dimensional nano-structures 134 can be linear protruding structures, dotted protruding structures or a combination of linear protruding structures and dotted protruding structures. A cross section of the linear protruding structure can be triangle, square, rectangular, trapezoidal, arc, semicircle, or other shapes. A shape of the dotted protruding structures can be sphere, ellipsoid, single layer of truncated pyramid, multi-layer of truncated pyramid, single layer of prism, multi-layer of prism, single layer of frustum, multi-layer of frustum or other shapes. The first three-dimensional nano-structures 134 can be uniformly distributed to form an array. The first three-dimensional nano-structures 134 in the array can be substantially equidistantly arranged, concentric circularly arranged, or concentric rectangularly arranged.

Figure 2:
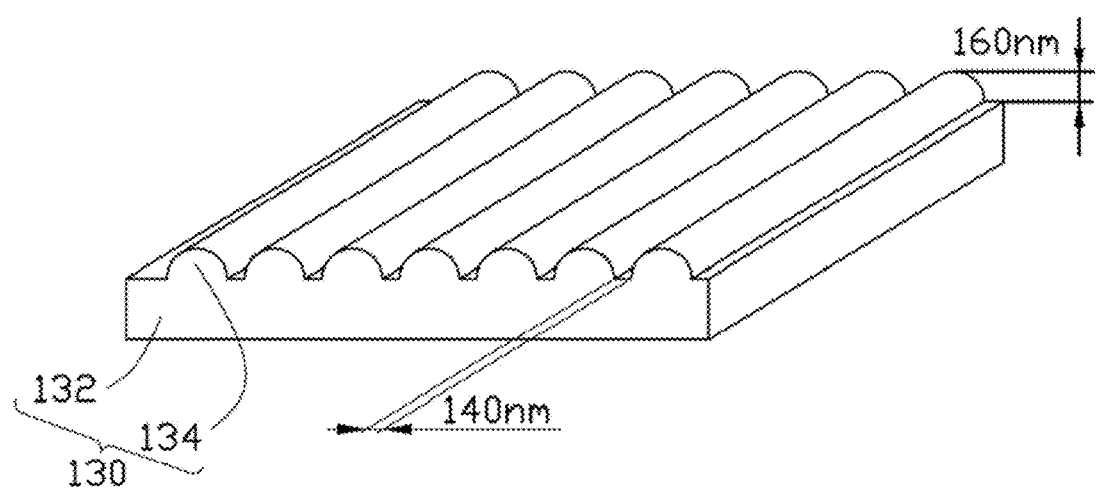
FIG. 2 is a schematic view of a second semiconductor layer of the light emitting diode shown in FIG. 1.
Figure 3:
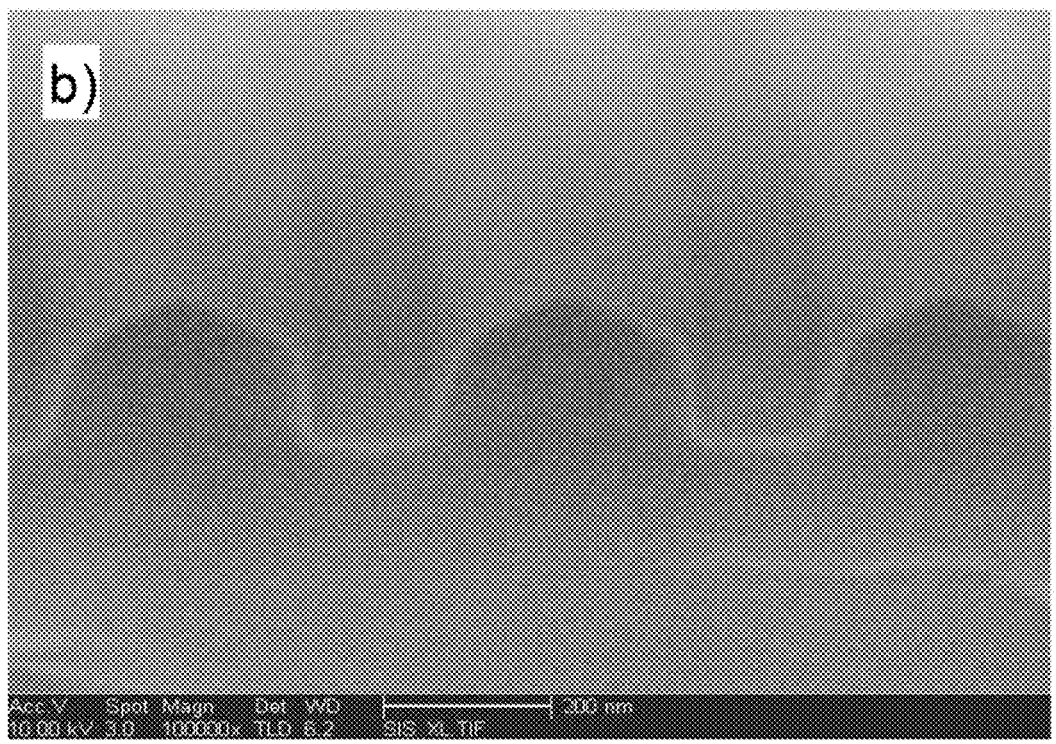
FIG. 3 shows a scanning electron microscope image of the second semiconductor layer shown in FIG. 2.

Referring to FIG. 2 and FIG. 3, in one embodiment, each second semiconductor layer 130 includes a number of equidistantly arranged linear protruding structures. A distance between adjacent equidistantly arranged linear protruding structures can range from about 100 nanometers to about 200 nanometers. In one embodiment, a distance between adjacent equidistantly arranged linear protruding structures is about 140 nanometers. A cross section of the equidistantly arranged linear protruding structure along its length direction can be a semicircle, and a diameter of the semicircle can range from about 100 nanometers to about 200 nanometers. In one embodiment, the diameter of the semicircle is about 160 nanometers.

A surface of each second semiconductor layer 130 away from the active layer 120 can be used as a light emitting surface of the LED 10. In one embodiment, the LED 10 includes two light emitting units, thus, the LED 10 includes two light emitting surfaces.

The first electrode 140 can be electrically connected to the first semiconductor layer 110 and spaced apart from the active layers 120. The first electrode 140 can cover at least part of the second region. The number of the first electrode 140 can be related to the number of the first semiconductor 110. The first electrode 140 can be a single layer structure or a multi-layer structure. A material of the first electrode 140 can be Ti, Ag, Al, Ni, Au, or a combination of thereof. The material of the first electrode 140 can also be indium-tin oxide (ITO) or carbon nanotube film. In one embodiment, the first electrode 140 is a two-layer structure including a Ti layer with a thickness of about 15 nm and an Au layer with a thickness of about 200 nanometers.

Each second electrode 150 can be electrically connected to each second semiconductor layer 130 respectively. The shape of each second electrode 150 is arbitrary and can be selected according to need. Each second electrode 150 can cover a part or the entire surface of each second semiconductor layer 130. A material of the second electrode 150 can be Ti, Ag, Al, Ni, Au, or a combination thereof. The material of the second electrode 150 can also be indium-tin oxide or carbon nanotube film. In one embodiment, each second electrode 150 is a two-layer structure including a Ti layer with a thickness of about 15 nm and an Au layer with a thickness of about 100 nanometers. The number of the second electrode 150 can be related to the number of the light emitting units.

A number of the second three-dimensional nano-structures (not shown) can be further located on the surface of the first semiconductor layer 110 away from the substrate 100 or on a surface of each active layer 120 away from the first semiconductor layer 110. The structures of the second three-dimensional nano-structures can be the same as or different from the structures of the first three-dimensional nano-structures 134. The second three-dimensional nano-structures can be linear protruding structures, dotted protruding structures or a combination of linear protruding structures and dotted protruding structures. Therefore, a contact surface between the active layer 120 and the first semiconductor layer 110, and a contact surface between the active layer 120 and the second semiconductor layer 130 can be increased. Thus, an electron-hole recombination density of each light emitting unit can be improved.

Furthermore, a reflector layer (not shown) can be located on a surface of substrate 100 away from the first semiconductor layer 110. A material of the reflector can be titanium, silver, aluminum, nickel, gold or a combination thereof. The reflector includes a smooth surface having a high reflectivity. The photons that reached the reflector can be reflected by the reflector, thus, these photons can be extracted out of the LED 10 to improve the light extraction efficiency of the LED 10.

In use of the LED 10, a voltage can be applied to the light emitting unit $A_1$ or the light emitting unit $A_2$. In one embodiment, a voltage is applied to the light emitting unit $A_1$, thus, holes and electrons can enter the active layer 120 of the light emitting unit $A_1$ and combine with each other to emit visible light. A first part of the visible light having a large incidence angle α (e.g. greater than 23.58°) can emit from the light emitting surface of the light emitting unit $A_1$. At the same time, a second part of the visible light having a small incidence angle α (e.g. less than 23.58°) can emit from the sidewalls of the light emitting unit $A_1$ and enter into the light emitting unit $A_2$, thus, a part of the second part of the visible light can emit from the light emitting surface of the light emitting unit $A_2$. Specifically, a part of the second part of the visible light can be refracted by air and the light emitting unit $A_2$ and then transfer into visible light having a large incidence angle α in light emitting unit $A_2$, thus, emitting from the light emitting surface of the light emitting unit $A_2$. Thus, the light extraction intensity of the LED can be enhanced. Furthermore, the LED 10 includes the first three-dimensional nano-structures 134 located on the light emitting surfaces, thus, the light extraction intensity of the LED can be further enhanced.

Figure 4:
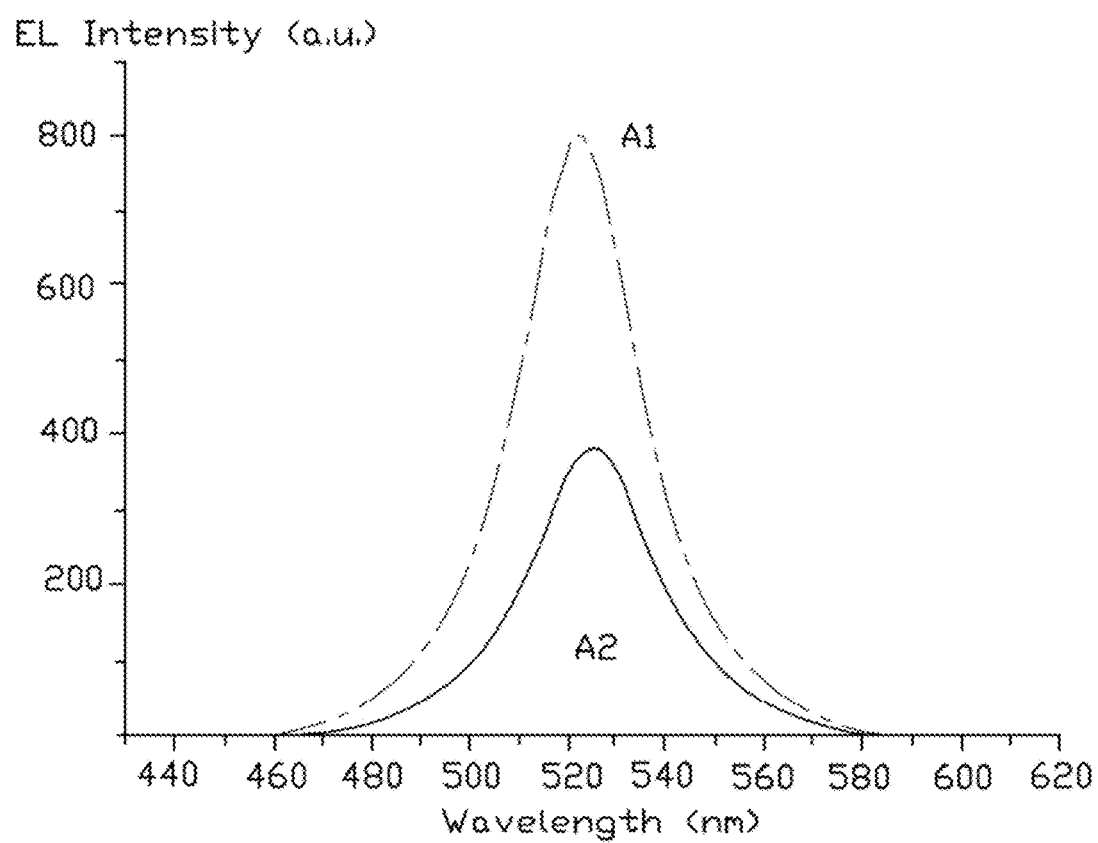
FIG. 4 shows light extraction intensity curves of the light emitting unit $A_1$ and light emitting unit $A_2$ respectively.

Referring to FIG. 4, the light extraction intensity of light emitting unit $A_2$ can reach 50% of the light extraction intensity of light emitting unit $A_1$. Furthermore, the light emitting unit $A_1$ and light emitting unit $A_2$ can be used in turns, thus, the life of the LED 10 can be improved.

Figure 5:
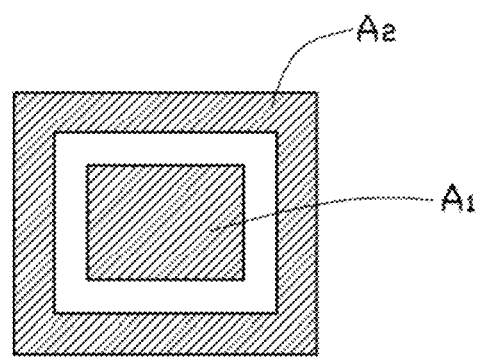
FIG. 5 is a top view of one embodiment of a light emitting diode.
Figure 6:
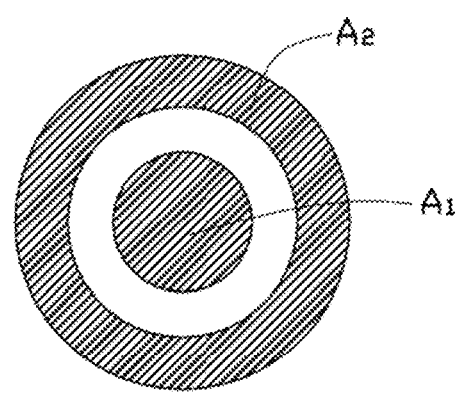
FIG. 6 is a top view of another embodiment of a light emitting diode.

The arrangement of the light emitting unit $A_1$ and light emitting unit $A_2$ is not limited. Referring to FIGS. 5 and 6, in some embodiments, the light emitting unit $A_1$ and light emitting unit $A_2$ are concentric circularly arranged, or concentric rectangle arranged. Thus, most of the visible light emitted from the sidewalls of the light emitting unit $A_1$ can enter into the light emitting unit $A_2$ and then emit from the light emitting surface of the light emitting unit $A_2$. The LED 10 can include more than two light emitting units uniformly distributed to form an array. The more than two light emitting units can also be apart from each other, just to make sure that the more than two light emitting units are located in the same plane, and a distance between adjacent light emitting units ranges from about 1 micron to about 1 millimeter.

In some embodiments, the LED 10 just share the same substrate 100, that is, the two first semiconductor layers 110 are spaced apart from each other, thus, two first electrodes 140 are electrically connected to each first semiconductor layer 110.

Figure 7:
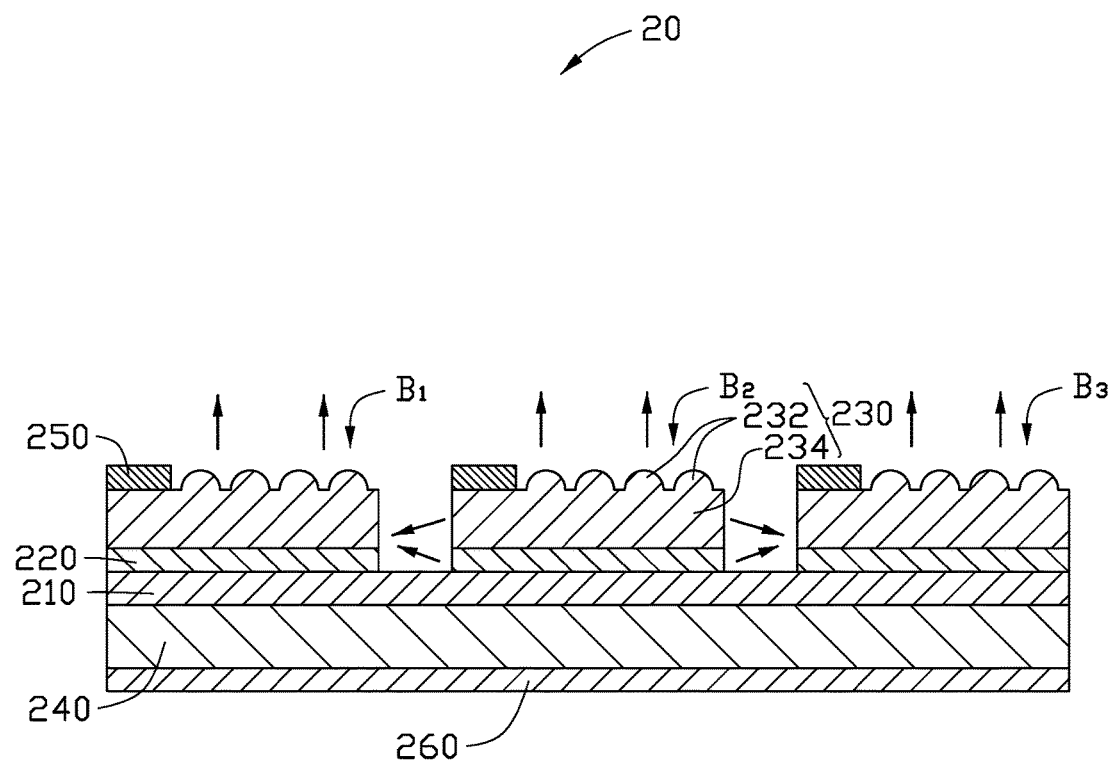
FIG. 7 is a profile view of another embodiment of a light emitting diode.

Referring to FIG. 7, another embodiment of an LED 20 is provided. The LED 20 includes a light emitting unit $B_1$, a light emitting unit $B_2$ and a light emitting unit $B_3$ located in the same plane. The light emitting unit $B_1$, the light emitting unit $B_2$ and the light emitting unit $B_3$ have a same second LED structure. Each second LED structure includes a first semiconductor layer 210, an active layer 220, a second semiconductor layer 230, a first electrode 240, and a second electrode 250.

The light emitting unit $B_1$, the light emitting unit $B_2$ and the light emitting unit $B_3$ can share a same first electrode 240 and a same first semiconductor layer 210, and the first electrode 240 can cover an entire surface of the first semiconductor layer 210 away from the active layer 220. The active layers 220 can be spaced apart from each, and each active layer 220 can be located on a first region of a surface of the first semiconductor layer 210 away from the first electrode 240. Each second semiconductor layer 230 can be located on a surface of each active layer 220. Each second electrode 250 can be electrically connected to each second semiconductor layer 230.

Each second semiconductor layer 230 can further include a body 232 and a plurality of first three-dimensional nano-structures 234, protruding out of a surface of the body 232. A surface of each second semiconductor layer 230 away from the active layer 220 can be a light emitting surface of the LED 20.

Furthermore, a reflector layer 260 can be located on and entirely covering a surface of the first electrode 240 away from the first semiconductor layer 210. The photons that reached the reflector layer 260 can be reflected by the reflector layer 260, thus, these photons can be extracted out of the LED 20 to improve the light extraction efficiency of the LED 20.

In use of the LED 20, a voltage can be applied to the light emitting unit $B_2$, thus, holes and electrons can enter the active layer 220 of the light emitting unit $B_2$ and combine with each other to emit visible light. A first part of the visible light can emit from the light emitting surface of the light emitting unit $B_2$. At the same time, a second part of the visible light can emit from sidewalls of the light emitting unit $B_2$ and enter into the light emitting unit $B_1$ and light emitting unit $B_3$, thus, a part of the second part of the visible light can emit from the light emitting surfaces of the light emitting unit $B_1$ and light emitting unit $B_3$.

It is to be noted that, the light emitting unit $B_1$, the light emitting unit $B_2$ and the light emitting unit $B_3$ can be spaced apart from each other. The light emitting unit $B_1$, the light emitting unit $B_2$ and the light emitting unit $B_3$ can be located on a same plane. A distance between adjacent light emitting unit can range from about 1 micron to about 1 millimeter.

Figure 8:
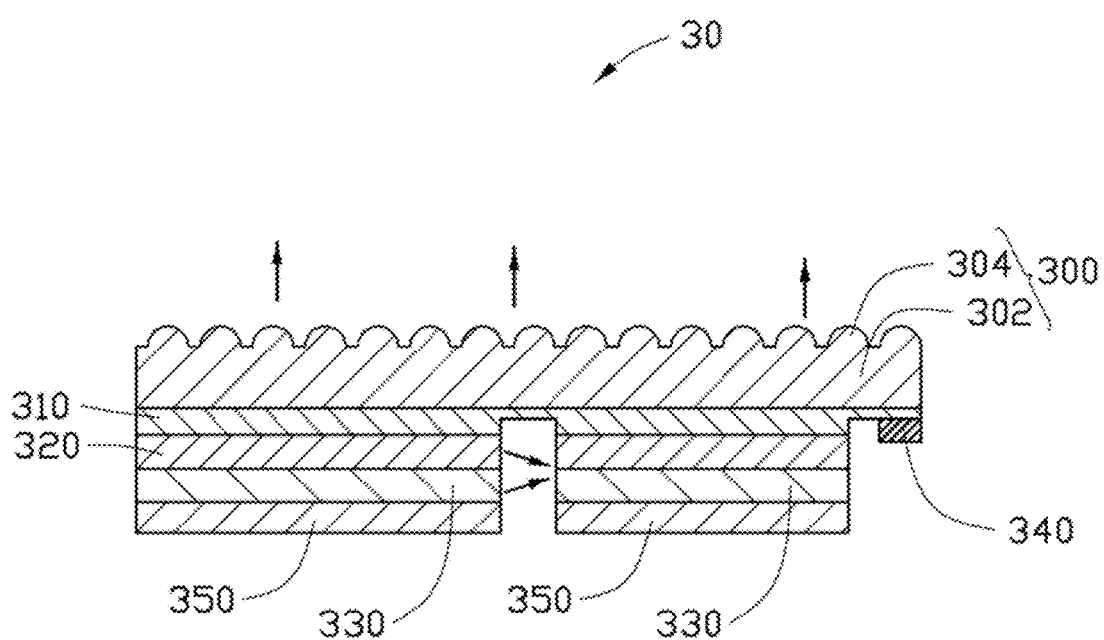
FIG. 8 is a profile view of other embodiment of a light emitting diode.

Referring to FIG. 8, another embodiment of an LED 30 is provided. The LED 30 includes a light emitting unit $C_1$ and a light emitting unit $C_2$ located on a same plane. The light emitting unit $C_1$ and the light emitting unit $C_2$ include a same third LED structure. Each third LED structure includes a substrate 300, a first semiconductor layer 310, an active layer 320, a second semiconductor layer 330, a first electrode 340, and a second electrode 350.

The light emitting unit $C_1$ and the light emitting unit $C_2$ can share a same first semiconductor layer 310, a same substrate 300 and a same first electrode 340, and the first semiconductor layer 310 can be located on a surface of the substrate 300. The active layers 320 can be spaced apart from each other, and each active layer 320 can be located on a first region of a surface of the first semiconductor layer 310 away from the substrate 300. The first electrode 340 can be located on a second region of the surface of the first semiconductor layer 310 away from the substrate 300. Each second semiconductor layer 330 can be located on a surface of each active layer 320 away from the first semiconductor layer 310. Each second electrode 350 can cover an entire surface of each second semiconductor layer 330 away from the active layer 320.

The substrate 300 can include a body 302 and a plurality of first three-dimensional nano-structures 304 protruding out of a surface of the body 302. A surface of the substrate 300 away from the first semiconductor layer 310 can be a light emitting surface of the LED 30.

Furthermore, a reflector layer (not shown) can be located on a surface of each second electrode 350 away from the active layer 320. In one embodiment, the reflector layer (not shown) covers the entire surface of each second electrode 350 away from the active layer 320. The method for using the LED 30 can be the same as the method for using the LED 10.

It is to be understood that the above-described embodiment is intended to illustrate rather than limit the disclosure. Variations may be made to the embodiment without departing from the spirit of the disclosure as claimed. The above-described embodiments are intended to illustrate the scope of the disclosure and not restricted to the scope of the disclosure.

What is claimed is:

1. A light emitting diode, comprising:
at least two light emitting units located on a plane, each light emitting unit comprising:
a first semiconductor layer, an active layer, a second semiconductor layer, a first electrode and a second electrode; the first semiconductor layer, the active layer, and the second semiconductor layer are stacked with each other in order; the first electrode is electrically connected with the first semiconductor layer; and the second electrode is electrically connected with the second semiconductor layer, wherein the at least two light emitting units share the same first semiconductor layer and share the same first electrode located on the first semiconductor layer;
wherein all of the active layers are spaced from each other and located on and abutting a planar surface of the first semiconductor layer, a distance between adjacent active layers ranges from about 1 micron to about 1 millimeter, and each of the at least two light emitting units is configured to extract visible light emitted from sidewalls of adjacent light emitting units; the first semiconductor layer has a second surface opposite to the planar surface, the planar surface comprises a plurality of first regions spaced apart from each other, and each active layer is located on one of the plurality of first regions; and in each light emitting unit, the first electrode covers an entirety of the second surface of the first semiconductor layer, and a reflector layer covers an entire surface of the first electrode away from the first semiconductor layer.

2. The light emitting diode of claim 1, wherein the plurality of first regions are equidistantly arranged, concentric circularly arranged, or concentric rectangularly arranged.

3. The light emitting diode of claim 1, wherein each active layer covers an entire surface of each first region.

4. The light emitting diode of claim 1, wherein each active layer comprises a layer of GaInN and a layer of GaN stacked with the GaInN layer.

5. The light emitting diode of claim 1, wherein in each light emitting unit, a plurality of linear protruding structures, dotted protruding structures, or a combination of linear protruding structures and dotted protruding structures are distributed on a surface of the second semiconductor layer away from the active layer.

6. The light emitting diode of claim 5, wherein cross sections of the linear protruding structures are triangle, square, rectangular, trapezoidal, arc, or semicircle.

7. The light emitting diode of claim 6, wherein the linear protruding structures are substantially parallel with each other and extend along a surface of the substrate, and each linear protruding structure extends from a first side of the substrate to a second side opposite to the first side, and each linear protruding structure has a length equal to a width of the substrate from the first side to the second side.

8. The light emitting diode of claim 5, wherein shapes of the dotted protruding structures are sphere, ellipsoid, single layer of truncated pyramid, multi-layer of truncated pyramid, single layer of prism, multi-layer of prism, single layer of frustum, or multi-layer of frustum.

9. The light emitting diode of claim 5, wherein a plurality of equidistantly arranged linear protruding structures are distributed on the surface of each second semiconductor layer away from the active layer, and a distance between adjacent ones of the plurality of linear protruding structures ranges from about 100 nm to about 200 nm.

10. The light emitting diode of claim 9, wherein a cross section of the plurality of equidistantly arranged linear protruding structures along their length direction is a semi-circle, and a diameter of the semicircle ranges from about 100 nm to about 200 nm.

11. The light emitting diode of claim 1, wherein the at least two light emitting units are equidistantly arranged, concentric circularly arranged, or concentric rectangularly arranged.

12. A light emitting diode, comprising:
two light emitting units located on a plane, each light emitting unit comprising:
a first semiconductor layer, an active layer, a second semiconductor layer, a first electrode and a second electrode; the first semiconductor layer, the active layer, and the second semiconductor layer are stacked with each other in order; the first electrode is electrically connected with the first semiconductor layer; and the second electrode is electrically connected with the second semiconductor layer, wherein the two light emitting units share the same first semiconductor layer and share the same first electrode located on the first semiconductor layer;
wherein the active layers are spaced from each other and located on a planar surface of the first semiconductor layer, a distance between adjacent active layers ranges from about 1 micron to about 1 millimeter, and the two light emitting units are concentric circularly arranged and one light emitting unit of the two light emitting units being encircled by the other of the two light emitting units, or concentric rectangle arranged; the first semiconductor layer has a second surface opposite to the planar surface, the planar surface comprises a plurality of first regions spaced apart from each other, and each active layer is located on one of the plurality of first regions; and in each light emitting unit, the first electrode covers an entirety of the second surface of the first semiconductor layer, and a reflector layer covers an entire surface of the first electrode away from the first semiconductor layer.

* * * * *